(12) United States Patent
Kuang et al.

(10) Patent No.: US 11,146,260 B1
(45) Date of Patent: Oct. 12, 2021

(54) CIRCUIT AND METHOD TO MANAGE AND RECOVER FROM BIAS TEMPERATURE INSTABILITY

(71) Applicant: HYGON INFORMATION TECHNOLOGY CO., LTD., Huayuan Industrial District (CN)

(72) Inventors: Jente B. Kuang, Austin, TX (US); Xiang Li, Austin, TX (US)

(73) Assignee: HYGON INFORMATION TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 16/940,945

(22) Filed: Jul. 28, 2020

(51) Int. Cl.
*H03K 17/14* (2006.01)
*H03K 19/003* (2006.01)
*H01L 27/02* (2006.01)
*H03K 17/0412* (2006.01)

(52) U.S. Cl.
CPC ....... *H03K 17/145* (2013.01); *H01L 27/0266* (2013.01); *H03K 17/04123* (2013.01); *H03K 19/00369* (2013.01)

(58) Field of Classification Search
None
See application file for complete search history.

(56) References Cited

U.S. PATENT DOCUMENTS 10,665,296 B1 * 5/2020 Wu ..................... G11C 29/028
10,761,130 B1 * 9/2020 van der Wagt .... G01R 31/2834

\* cited by examiner

*Primary Examiner* — Cassandra F Cox
(74) *Attorney, Agent, or Firm* — Loeb & Loeb, LLP (57) ABSTRACT

A circuit includes a voltage bus, a load, a plurality of switches, a controller, an encoder, a first switch group, and a second switch group. The first switch group is electrically connected between the voltage bus and the load. The second switch group is also electrically connected between the voltage bus and the load. The controller provides a first output signal indicating a required number of switches to be turned on to meet a power demand of the load. The encoder is configured to select a first combination of on/off states of the first switch group and the second switch group based on (i) the first output signal from the controller and (ii) a second combination of on/off states of the first switch group and the second switch group, and in response to selecting the first combination, transmit a switch signal to effect the first combination.

14 Claims, 5 Drawing Sheets

CIRCUIT AND METHOD TO MANAGE AND RECOVER FROM BIAS TEMPERATURE INSTABILITY

BACKGROUND

1. Field of the Invention

The present disclosure relates to circuits and methods to manage and recover from bias temperature instability.

2. Technical Background

Bias Temperature Instability (BTI) is a reliability issue in metal oxide semiconductor field effect transistors (MOSFETs). BTI affects MOSFETs by changing the threshold voltage $V_t$ required to open the channel in a MOSFET, and decreasing hole mobility, drain current, transconductance, and off current. BTI is caused by elevated temperatures and prolonged periods of the MOSFET being in an on state (which imparts gate bias over time). BTI can manifest in p-channel MOSFETs as Negative Bias Temperature Instability (NBTI) which causes the threshold voltage $V_t$ to increase, and in n-channel MOSFETs as Positive Bias Temperature Instability (PBTI) which causes the threshold voltage $V_t$ to decrease.

A related approach to managing BTI is by designing oversize systems. In an oversize system, the voltage signal to the MOSFETs can be larger than required to open the channel to account for the threshold voltage changes caused by BTI, and/or the specified throughput of the MOSFETs can be greater than required by the load to account for decreased drain current caused by BTI.

BTI is particularly an issue of increasing importance in the field of microprocessor technology. Microprocessors can have on core MOSFETs to provide power to the processor core (the load). Even at idle, modern microprocessor cores normally require more than 50% of connected MOSFETs to provide voltage ($V_{DDCORE}$) to meet power demands of a processor core. In light of the related groupings of MOSFETs, this results in the largest groups of MOSFETs almost always being in the on state, resulting in BTI.

Demands on microprocessor design exacerbate the problem of BTI. Microprocessors can incorporate an on-die digital low-dropout regulator (DLDO) including MOSFETs to provide power to a processing core. A DLDO can regulate power by turning on a plurality of groups of switches, the number of which can provide power that is greater than or equal to power demand of a load such as the processing core. Space limitations on a microprocessor die limit the size of the DLDO, meaning the number of MOSFETs is limited by space constraints, which consequently limits the maximum throughput of the available MOSFETs relative to the load. In addition, demand for reducing power consumption has resulted in lower operating voltages, which in turn limits the maximum voltage signal that can be provided as the threshold voltage $V_t$. These emerging realities of microprocessor design limit the related method of designing an oversize circuit to account for BTI.

Figure 1A:
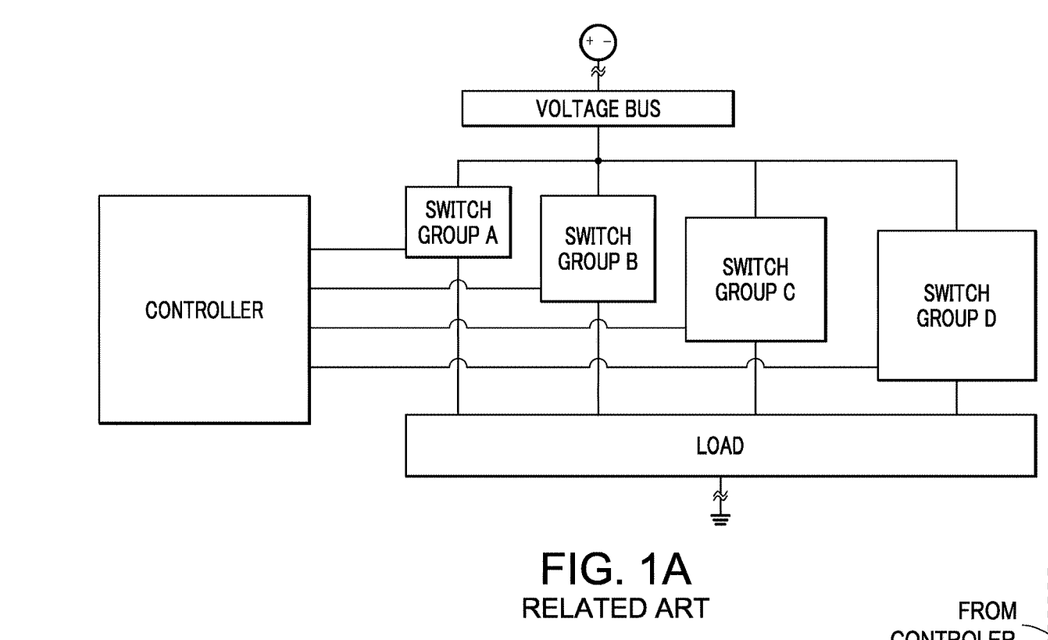
FIG. 1A is a diagram of related circuit.
Figure 1B:
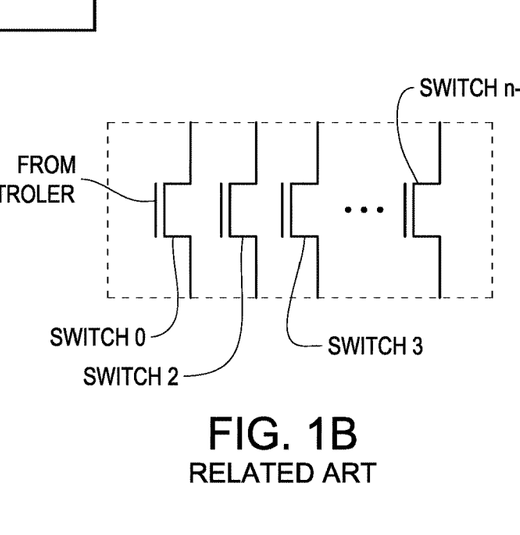
FIG. 1B is a diagram of a related group of switches.

By way of example, FIGS. 1A and 1B are a schematic diagram of a simplified related DLDO implemented in microprocessors. The related DLDO includes a voltage bus, a controller, and a plurality of groups of switches which are connected to a load. As shown in FIG. 1A, the plurality of groups of switches of the simplified related DLDO includes a switch group A, a switch group B, a switch group C, and a switch group D. The switch groups A, B, C, and D are connected in parallel between the voltage bus and the load (a processing core), and are controlled by the controller.

FIG. 1B schematically illustrates the basic structure of each of the switch groups A, B, C, and D. The size of each of the switch groups A, B, C, and D is binary weighted. In other words, the switch group B has twice as many MOSFETs as the switch group A, the switch group C has twice as many MOSFETs as the switch group B, and the switch group D has twice as many MOSFETs as the switch group C. Thus, the switch group B can provide twice as much power as the switch group A, the switch group C can provide twice as much power as the switch group B, and the switch group D can provide twice as much power as the switch group C.

The controller incorporates a digital compensator to calculate the required switch strength to match the target power demand provided by the system. The controller determines a power demand and controls the switch groups A, B, C, and D to meet the power demand by turning on the least number of the switch groups A, B, C, and D to meet the power demand. It is commonly the case that the power demand of a processor core is equal to or greater than half of the power capacity of the DLDO, even at idle. Accordingly, the switch group D is almost always on. Over time, the threshold voltage $V_t$ becomes unstable for the MOSFETs of the switch group D, and drain current from the MOSFETS of the switch group D decreases. When the drain current is below the power demand of the processor core, the processor core becomes unstable. Thus, there is a need to address BTI within the demands of microprocessor design.

SUMMARY

Exemplary embodiments of the broad inventive principles described herein address the aforementioned problems by providing a circuit and a method to preserve the long-term reliability and robustness of digital low drop-out regulators by managing and allowing MOSFETs to rest and recover from BTI by subdividing groups of MOSFETs and orthogonally controlling the subdivided groups of MOSFETs.

BTI can be effectively eliminated from a MOSFET by resting the MOSFET. In other words, by allowing a MOSFET to remain in the off state, the effects of BTI are reversed, and the MOSFET will again operate within its designed specifications when it is next turned on to the on state.

A circuit has, for example on a processor die, a voltage bus, a load, a plurality of switches, a controller, and an encoder. The plurality of switches includes a first switch group and a second switch group. The first switch group is electrically connected between the voltage bus and the load, and the first switch group comprises N switches connected in parallel, where N is an integer greater than or equal to 1. The second switch group is also electrically connected between the voltage bus and the load, and the second switch group comprises M switches connected in parallel, where M is an integer multiple of N. The controller is configured to provide a first output signal indicating a required number of switches to be turned on to meet a power demand of the load. The encoder is electrically connected to the controller, the first switch group, and the second switch group. The encoder is configured to select a first combination of on/off states of the first switch group and the second switch group based on (i) the first output signal from the controller and (ii) a second combination of on/off states of the first switch group and the second switch group, and in response to selecting the first combination, transmit a switch signal to effect the first combination.

The aforementioned circuit decelerates the aging problem due to statistically uneven wear on a large number of MOSFETs from the effects of BTI. In addition, it improves long-term yield, functional robustness, and overall chip reliability. These benefits allow for tightening the design margin by decreasing variation in timing and power.

Moreover, these benefits can be attained with minimal tuning of a fabrication process, which results in a minimizing overall product cost and investment for implementation. As mentioned above, the aforementioned circuit allows for orthogonally controlling the subdivided groups of MOSFETs. The circuit is orthogonal because existing methods of control implemented in controllers used in the related art can be implemented without modification, as will be explained in further detail below.

It should be understood that the following disclosure is not limited to resting and recovering from BTI for only microprocessors. Rather, there are many different applications of the circuit and method in DLDOs explained in further detail below.

DETAILED DESCRIPTION OF EMBODIMENTS

Exemplary embodiments of a circuit and method to manage and recover from bias temperature instability (BTI) are described below in detail.

(1) First Embodiment

Figure 2:
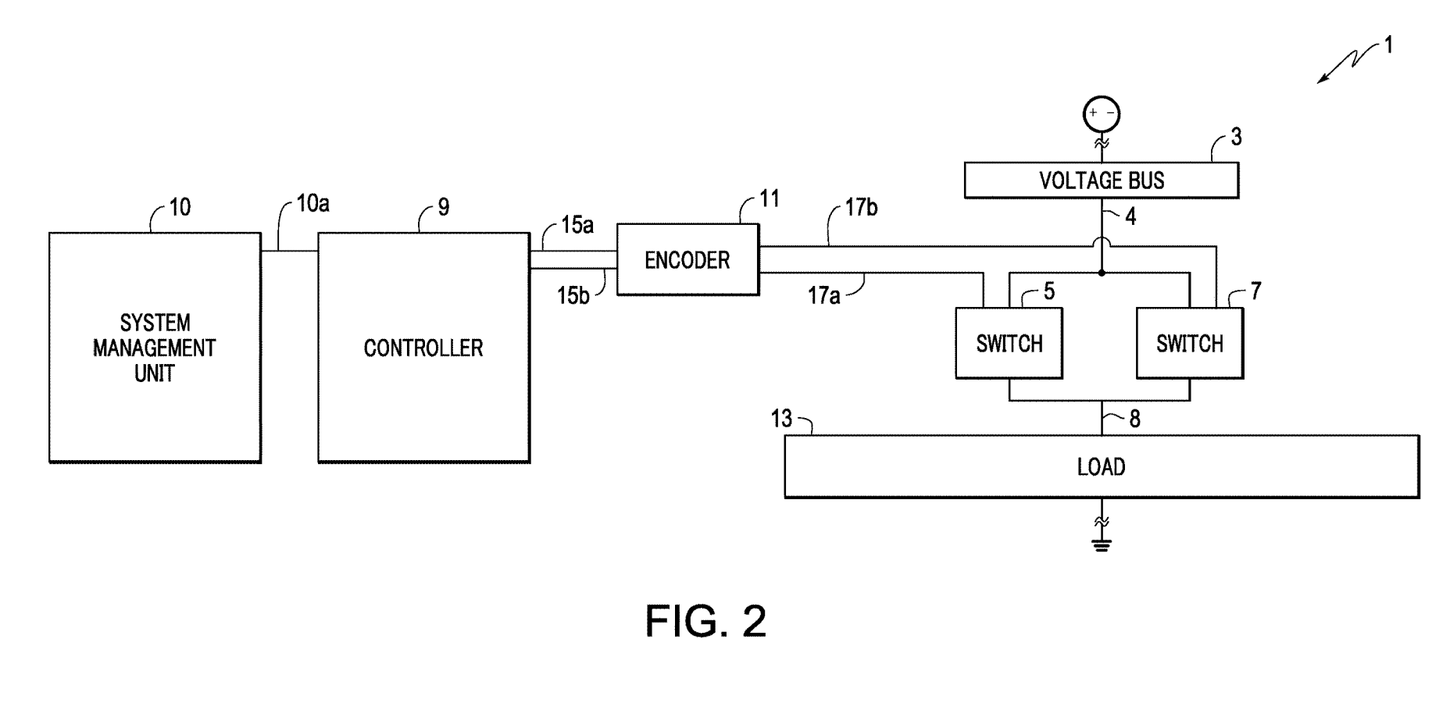
FIG. 2 is a diagram of an exemplary embodiment.

As illustrated in FIG. 2, a circuit 1 according to a first embodiment includes a voltage bus 3, a first switch 5, a second switch 7, a controller 9, an encoder 11, and a load 13. The voltage bus 3 is electrically connected to the first switch 5 and to the second switch 7, and can provide a supply voltage $R_{VDD}$ to each of the first switch 5 and the second switch 7. The controller 9 is electrically connected to the encoder 11 and provides control signals 15a and 15b to the encoder 11. The encoder 11 is electrically connected to the first switch 5 and to the second switch 7, and can provide a gate signal 17a to the first switch 5 and a gate signal 17b to the second switch 7. The first switch 5 can turn to the on and off states based on the gate signal 17a, and the second switch 7 can turn to the on and off states based on the gate signal 17b. When the first switch 5 is in the on state, the load 13 receives a core voltage $V_{DDCORE}$ from the first switch 5. When the second switch 7 is in the on state, the load 13 receives the core voltage $V_{DDCORE}$ from the second switch 7. When the first switch 5 is in the off state, the load 13 does not receive the core voltage $V_{DDCORE}$ from the first switch 5. When the second switch 7 is in the off state, the load 13 does not receive the core voltage $V_{DDCORE}$ from the second switch 7. The circuit 1 is currently described as a pull down stack, however those of ordinary skill in the art would understand that the circuit 1 can be implemented as a pull up stack to manage and recover from BTI based on the same principles. The load 13 is, for example, a processor core, multiple processor cores, or other such electrical element that requires provision of a supply voltage.

The Bus 3

The bus 3 can be electrically connected to at least one power supply to receive electricity, and be electrically connected to the switches 5 and 7 to provide the supply voltage $R_{VDD}$ to each of the first switch 5 and the second switch 7. The supply voltage $R_{VDD}$ is a voltage that the first and second switches 5 and 7 can accept, and use to provide to the load 13 as the core voltage $V_{DDCORE}$. The bus 3 can be made of, for example, a conductive material (such as aluminum, copper, gold, etc.) that electrically connects the at least one power supply to the first switch 5 and the second switch 7.

The Switches 5 and 7

The first switch 5 and the second switch 7 are switches electrically connected to the bus 3, the encoder 11, and the load 13. The first and second switches 5 and 7 receive the supply voltage $R_{VDD}$ from the bus 3 via a bus connector 4. The bus connector 4 is an electrical connector made of an electrically conductive material (e.g., aluminum, copper, gold, etc.). When the first switch 5 receives the gate signal 17a from the encoder 11, and the gate signal 17a is greater than or equal to the threshold voltage $V_t$, the first switch 5 is caused to be in the on state and provides the load 13 with the core voltage $V_{DDCORE}$ via a load connector 8. Similarly, when the second switch 7 receives the gate signal 17b from the encoder 11, and the gate signal 17b is greater than or equal to the threshold voltage $V_t$, the second switch 7 is caused to be in the on state and provides the load 13 with the core voltage $V_{DDCORE}$ via the load connector 8. The load connector 8 is an electrical connector made of an electrically conductive material (e.g., aluminum, copper, gold, etc.).

In the first embodiment, the first switch 5 and the second switch 7 are structurally identical. Each of the first switch 5 and the second switch 7 include one or more MOSFETs. Each MOSFET in the first switch 5 can receive the gate signal 17a from the encoder 11 at a gate input, receive the supply voltage $R_{VDD}$ from the voltage bus 3 at a source input, and output the core voltage $V_{DDCORE}$ to the load 13 from a drain when the MOSFET is in the on state as described above. Similarly, each MOSFET in the second switch 7 can receive the gate signal 17b from the encoder 11 at a gate input, receive the supply voltage $R_{VDD}$ from the voltage bus 3 at a source input, and output the core voltage $V_{DDCORE}$ to the load 13 from a drain when the MOSFET is in the on state as described above. In this embodiment, each of the first switch 5 and the second switch 7 have the same number and type of MOSFETs. Accordingly, each of the first switch 5 and the second switch 7 can respectively provide the same amount of power to the load 13. Thus, the total power throughput the circuit 1 can provide to the load 13 is the sum of a power throughput of the first switch 5 and a power throughput of the second switch 7.

The Controller 9

The controller 9 determines a number of switches required to be turned on to meet a power demand of the load 13. The controller 9 includes a power supply monitor to measure power supply voltages. The power supply monitor is, for example, a voltage sensor. The controller 9 includes a digital compensator to match measured supply voltages to targeted values provided by a system management unit 10 via a supply signal 10a. the digital compensator is electronic circuitry, such as logic gates, or a processor, implemented as part of the controller. The controller 9 is implemented as electronic circuitry, such as logic gates, or a processor.

The controller 9 receives the power demand of the load 13 from the system management unit 10, and makes a determination of a number of switches of the first switch 5 and the second switch 7 that should be turned on to meet the demand. The controller 9 then generates a control signal 15a that signals whether the number of switches included in the first switch 5 should be in the on or off state, and a control signal 15b that signals whether the whether the number of switches included second switch 7 should be in the on or off state. The control signals 15a and 15b are sent to the encoder 11. Essentially, the controller 9 determines the number of switches that should be turned on to meet the power demand of the load 13, and outputs the control signals 15a and 15b to indicate this number of switches. Although FIG. 2 illustrates a first electrical connection for the control signal 15a and a second electrical connection for the control signal 15b, the control signals 15a and 15b can be sent over a single electrical connection. Although control signals 15a and 15b are described and illustrated as different signals, the control signals 15a and 15b can alternatively be considered as components of a single control signal.

The Encoder 11

The encoder 11 locates between the controller 9 and the first switch 5 and the second switch 7. The encoder 11 can, for example, be made from one or more logic gates. The encoder 11 implements a specific wear leveling policy. A wear leveling policy is a protocol implemented to mitigate BTI wear in a group of switches. For example, the encoder 11 can implement the wear leveling policy based on a state machine by unsupervised (i.e., machine) learning.

The encoder 11 receives the control signals 15a and 15b from the controller 9. The encoder 11 includes a wear counter. The encoder 11 then determines the number of switches that need to be open based on the control signals 15a and 15b.

In the first embodiment, the encoder 11 implements a round-robin wear leveling policy. In the context of the circuit 1, the round-robin wear policy implements a cyclic order of different combinations of on/off states of switches. For example, a first combination of on/off states is when the first switch 5 is in the on state, and the second switch 7 is in the off state. A second combination of on/off states is when the first switch 5 is in the off state, and the second switch 7 is in the on state. Thus, each of the first combination and the second combination will indicate the same number of switches in the on state and the same number of switches in the off state. By implementing the round-robin wear leveling policy, the encoder 11 can cycle between the first state and the second state when the number of switches indicated by the control signals 15a and 15b is equal to the number of switches in one of the first switch 5 and the second switch 7. In other words, by implementing the round-robin wear leveling policy, BTI wear can be mitigated by alternating between the first switch 5 and the second switch 7 when successive control signals request the same number of switches to be turned on.

If the control signals 15a and 15b from the controller 9 indicate that no switches should be turned on, the encoder 11 outputs a gate signal 17a to the first switch 5 indicating that the first switch 5 should be in the off state, and outputs a gate signal 17b to the second switch 7 indicating that the second switch 7 should be in the off state. If the sum of the number of switches indicated by each of the control signals 15a and 15b is equal to the sum of the number of switches present in the first switch 5 and the second switch 7, the encoder outputs the gate signal 17a to the first switch 5 indicating that the first switch 5 should be in the on state, and the gate signal 17b to the second switch 7 indicating that the second switch 7 should be in the on state.

When the control signals 15a and 15b are different, meaning the control signals 15a and 15b indicate a number of switches equal to the number of switches in each of the first switch 5 and the second switch 7, the encoder references the wear counter. The wear counter can indicate a number of different states according to the largest number of different combinations of on/off states of the switch 5 and the switch 7 for any given power demand, using a unique indicator for each of those different states. The wear counter is configured to cycle among the largest number of different combinations of on/off states of the first switch 5 and the second switch 7 to match any given power demand. For example, the largest number of different combinations of on/off states of the switch 5 and the switch 7 is 2, and is present when the power demand is 1. In other words, in the first embodiment, the wear counter must include indicators for 2 different combinations of on/off states of the switch 5 and the switch 7 when the power demand is 1. As described above with respect to the round-robin wear leveling policy, the encoder 11 cycles through the states by incrementing the wear counter by 1 each time a trigger (described below) is received. The wear counter can be implemented as internal clock circuitry that can store and cycle through the values of the wear counter.

The indicators of the wear counter, the states of the control signals 15a and 15b and the gate signals 17a and 17b can be organized into a table as follows.

TABLE 1

| Wear Counter | Control Signal 15a | Control Signal 15b | Gate Signal 17a | Gate Signal 17b |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 1 |
| 1 | 0 | 0 | 0 | 0 |
| 1 | 0 | 1 | 1 | 0 |
| 1 | 1 | 0 | 1 | 0 |
| 1 | 1 | 1 | 1 | 1 |

In Table 1, the value "0" indicates an on state, and the value "1" indicates an off state with respect to the control signals 15a and 15b, and the gate signals 17a and 17b. The first switch 5 receives the gate signal 17a, and turns to an on state or an off state as indicated by the gate signal 17a. The second switch 7 receives the gate signal 17b, and turns to an on state or an off state as indicated by the gate signal 17b. In this embodiment, the wear counter is incremented every time only one of the control signals 15a and 15b indicates the on state.

As shown in Table 1, the encoder can provide wear leveling by alternating which of the first switch 5 and the second switch 7 are in the on state when only one of the control signals 15a and 15b indicate an on state. This prevents the situation in which only one of the switches 5 and 7 is constantly in the on state when the controller 9 determines that only half of the total power capacity of the first switch 5 and the second switch 7 should be in the on state to meet the power demand of the load 13. The encoder 11 determines the gate signals 17a and 17b based on the inputs of the wear counter, the control signal 15a, and the control signal 15b; and outputs the gate signals 17a and 17b.

The first switch 5 receives the gate signal 17a from the encoder 11, and the second switch 7 receives the gate signal 17b from the encoder 11. The first switch 5 is enabled to turn on when the gate signal 17a indicates an on state, and is disabled from turn on when the gate signal 17a indicates an off state. The second switch 7 is enabled to turn on when the gate signal 17b indicates an on state, and is disabled from turn on when the gate signal 17b indicates an off state.

(2) A Method for Mitigating BTI Stress by Wear Leveling

Figure 3:
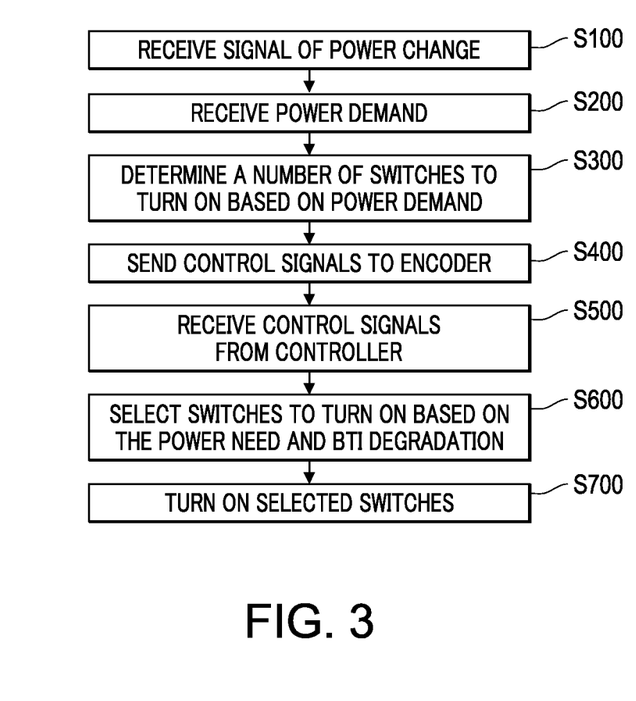
FIG. 3 is a flowchart of an exemplary method.

As illustrated in FIG. 3, a method of mitigating uneven BTI stress wear by using BTI stress wear leveling will be described.

In a step S100, the controller 9 receives a trigger. The trigger indicates that the power demand of the load 13 is being updated. The trigger can be, for example, when the system voltage, frequency, or function mode of the load 13 changes which is indicated by a wake signal received by the controller 9 from a wake bus (not illustrated). Alternatively, the trigger can be received when accumulated wear information exceeds a predetermined threshold for a switch or group of switches, according to a scheduled event (e.g., monthly, seasonal, semi-annual, etc.), or when a wear leveling firmware is updated.

After receiving the trigger in a step S100, the controller 9 receives the power demand of the load 13 via the supply signal 10a in a step S200, and determines a number of switches that should be turned on to meet the power based on the switches 5 and 7 in a step S300.

In the step S300, if the power demand is 0, such as when the load 13 is in a non-function mode, the controller 9 determines that both the control signal 15a and the control signal 15b indicates an off state. If the power demand is half of the total power throughput of the first switch 5 and the second switch 7, the controller 9 determines that the control signals 15a and 15b indicates that 0 switches should be in the on state. If the power demand is greater than half of the total power throughput of the sum of the number of switches of the first switch 5 and the second switch 7, the controller 9 determines that the control signals 15a and 15b indicate the sum of the number of switches of the first switch 5 and the second switch 7. Upon determining the control signals 15a and 15b, the controller 9 sends the control signals 15a and 15b to the encoder 11 in a step S400.

In a step S500, the encoder 11 receives the control signals 15a and 15b from the controller 9. Then, the method moves on to a step S600 to select switches to turn on based on the control signals 15a and 15b. If both of the control signals 15a and 15b indicate an off state (0 switches in the on state), the encoder 11 selects neither of the first switch 5 and the second switch 7 to be turned on, and determines that both of the gate signals 17a and 17b indicate an off state, as shown in Table 1. If only one of the control signals 15a and 15b indicates an on state, the encoder 11 increments the wear counter, and selects one of the combinations of on/off states of the switches 5 and 7 based on the wear counter, the first control signal 15a, and the second control signal 16b. The encoder 11 determines the states of the gate signals 17a and 17b as shown in Table 1. By referencing the wear counter, the encoder 11 bases the selection of one of the combinations of on/off states on the previously selected combination due to the nature of the round-robin wear leveling policy. Similarly, if both of the control signals 15a and 15b indicate an on state, the encoder 11 determines that both of the gate signals 17a and 17b are in the on state, as shown in Table 1.

Upon determining the states indicated by the gate signals 17a and 17b, the encoder 11 outputs the gate signals 17a and 17b to the switches 5 and 7, and the switches 5 and 7 are turned to the state indicated by the gate signals 17a and 17b, in a step S700.

(3) Second Embodiment

Figure 4:
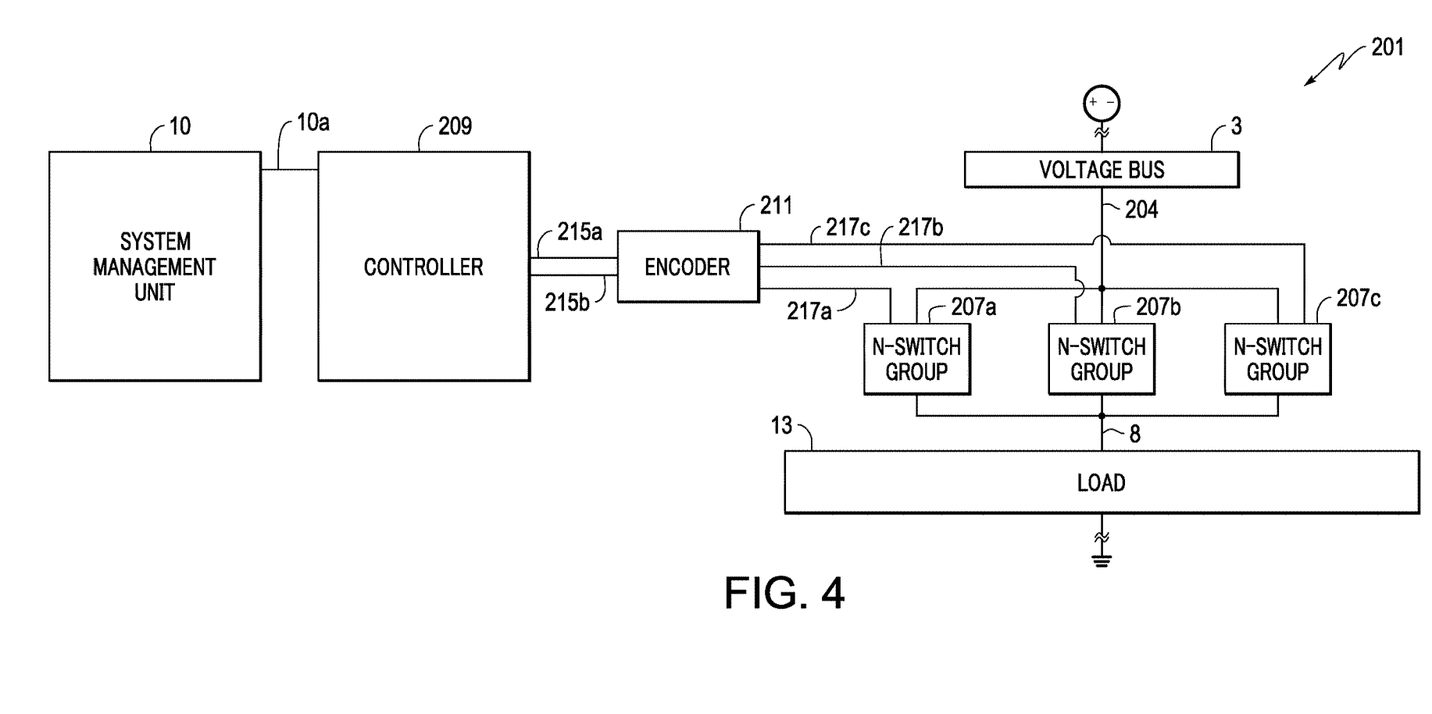
FIG. 4 is a diagram of a second exemplary circuit.

In a second embodiment, the circuit 201 as shown in FIG. 4 includes several elements that are substantially the same as in the circuit 1, as shown in FIG. 2.

In the circuit 201, a bus connector 204 is substantially the same as the bus connector 4 except that it is connected to three N-switch groups 207a, 207b, and 207c. Each of the N-switch groups 207a, 207b, and 207c are electrically connected to the bus 3, an encoder 211, and the load 13. Each of the N-switch groups 207a, 207b, and 207c supply voltage $R_{VDD}$ from the bus 3 via the bus connector 204. When the N-switch group 207a receives a gate signal 217a from the encoder 211, and the gate signal 217a is greater than or equal to the threshold voltage $V_t$, the N-switch group 207a is caused to be in the on state, and provides the load 13 with the core voltage $V_{DDCORE}$ via a load connector 8. Similarly, when the N-switch group 207b receives the gate signal 217b from the encoder 211, and the gate signal 217b is greater than or equal to the threshold voltage $V_t$, the N-switch group 207b is caused to be in the on state, and provides the load 13 with the core voltage $V_{DDCORE}$ via the load connector 8. When the N-switch group 207c receives the gate signal 217c from the encoder 211, and the gate signal 217c is greater than or equal to the threshold voltage $V_t$, the N-switch group 207c is caused to be in the on state, and provides the load 13 with the core voltage $V_{DDCORE}$ via the load connector 8.

In the circuit 201, each of the N-switch groups 207a, 207b, and 207c are structurally identical. Each of the N-switch groups 207a, 207b, and 207c includes the same integer number N of one or more MOSFETs. Each MOSFET in the N-switch groups 207a can receive the gate signal 217a from the encoder 211 at a gate input, receive the supply voltage $R_{VDD}$ from the voltage bus 3 at a source input, and output the core voltage $V_{DDCORE}$ to the load 13 from a drain when the MOSFET is in the on state as described above. Similarly, each MOSFET in the N-switch groups 207b can receive the gate signal 217b from the encoder 211 at a gate input, receive the supply voltage $R_{VDD}$ from the voltage bus 3 at a source input, and output the core voltage $V_{DDCORE}$ to the load 13 from a drain when the MOSFET is in the on state as described above. Each MOSFET in the N-switch groups 207c can receive the gate signal 217c from the encoder 211 at a gate input, receive the supply voltage $R_{VDD}$ from the voltage bus 3 at a source input, and output the core voltage $V_{DDCORE}$ to the load 13 from a drain when the MOSFET is in the on state as described above. Accordingly, each of the N-switch groups 207a, 207b, and 207c can respectively provide the same amount of power. Thus, the total power throughput the circuit 201 can provide to the load 13 is the sum of the power throughputs of the N-switch groups 207a, 207b, and 207c.

The circuit 201 includes the controller 209. The controller 209 is similar to the controller 9. The controller 209 receives the power demand of the load 13 from the system management unit 10, and makes a determination of which switches should be turned on to meet the power demand. Unlike the controller 9, the controller 209 is not mapped to output a control signal that corresponds to each of the N-switch groups 207a, 207b, and 207c. The controller 209 operates such that a first control signal 215a and a second control signal 215b are output to the encoder 211, which is described below. The first control signal 215a can indicate that a number of switches equal to twice the number N switches of each of the N-switch groups 207a, 207b, and 207c should be turned on. The second control signal 215b can indicate that a number of switches equal to the number N of any of the N-switch groups 207a, 207b, and 207c should be turned on. In other words, because each of the N-switch groups 207a, 207b, and 207c each have N switches, the controller 209 can output a binary weighted signal via the first control signal 215a and the second control signal 215b, indicating any of the multiples 0, 1, 2, or 3 of the number N switches should be turned on.

The control signals 215a and 215b are sent to the encoder 211. Although FIG. 4 illustrates a first electrical connection for the control signal 215a and a second electrical connection for the control signal 215b, the control signals 215a and 215b can be sent over a single electrical connection. Although control signals 215a and 215b are described and illustrated as different signals, the control signals 215a and 215b can alternatively be considered as components of a single control signal The encoder 211 locates between the controller 209 and the N-switch groups 207a, 207b, and 207c. The encoder 211, like the encoder 11, implements a specific wear leveling policy. For example, the encoder 211 can implement a wear leveling policy based on a state machine by unsupervised learning. In the second embodiment, the encoder 211 implements a round-robin wear leveling policy like the encoder 11 of the first embodiment, In the context of the circuit 201, the round-robin wear policy implements a cyclic order of different combinations of on/off states of switches. For example, a first combination of on/off states is when the N-switch group 207a is in the on state, the N-switch group 207b is in the on state, and the N-switch group 207c is in in the off state. A second combination of on/off states is when the N-switch group 207a is in the off state, the N-switch group 207b is in the on state, and the N-switch group 207c is in the on state. A third combination of on/off states is when the N-switch group 207a is in the on state, the N-switch group 207b is in the off state, and the N-switch group 207c is in the on state. Thus, each of the first combination, the second combination, and the third combination will indicate the same number of switches in the on state and the same number of switches in the off state. By implementing the round-robin wear leveling policy, the encoder 211 can sequentially cyclically cycle between the first state, the second state, and the third state. By implementing the round-robin wear leveling policy, the encoder 211 can cycle between the first state, the second state, and the third state when the number of switches indicated by the control signals 215a and 215b is equal to the number of switches in two times N. In other words, by implementing the round-robin wear leveling policy, BTI wear can be mitigated by cycling through the first to third combinations when successive control signals request the two times N number of switches to be turned on.

The encoder 211 receives the control signals 215a and 215b from the controller 209. The encoder 211 also includes a wear counter. The encoder 211 then determines the number of switches that need to be open based on the control signals 215a and 215b, each of the control signals 215a and 215b indicating a multiple of N switches as described above. Because the controller 209 can output a binary weighted signal via the first control signal 215a and the second control signal 215b, the encoder 211 allows for implementation of related methods of determining power demand that rely on binary weighted groups of switches.

If the control signals 215a and 215b from the controller 209 indicate a multiple of 0 of N switches should be in the on state (i.e., the control signal 215a indicating off and the control signal 215b indicating off), the encoder 211 outputs a gate signal 217a to the N-switch group 207a indicating that the N-switch group 207a should be in the off state, outputs a gate signal 217b indicating that the N-switch group 207b should be in the off state, and outputs a gate signal 217c indicating that the N-switch group 207c should be in the off state.

If the control signals 215a and 215b from the controller 209 indicate a multiple of 1 of N switches should be in the on state (the control signal 215a indicating off and the control signal 215b indicating on), the encoder 211 selects only one of the gate signals 217a, 217b, and 217c to be in the on state, and outputs the remaining two of the gate signals 217a, 217b, and 217c to be in the off state. The selected one of the gate signals 217a, 217b, and 217c is selected based on the wear leveling policy, such as the round robin policy described above, to mitigate BTI wear by avoiding having only one of the N-switch groups 207a, 207b, and 207c being in the on state responsive to successive indications of the control signals 215a and 215b indicating a multiple of 1 of N switches should be in the on state.

If the control signals 215a and 215b from the controller 209 indicate a multiple of 2 of N switches should be in the on state (i.e., the control signal 215a indicating on and the control signal 215b indicating off), the encoder 211 selects two of the gate signals 217a, 217b, and 217c to indicate the on state, and outputs the remaining one of the gate signals 217a, 217b, and 217c as indicating the off state. The selected two of the gate signals 217a, 217b, and 217c are selected based on the wear leveling policy, such as the round robin policy described above, to mitigate BTI wear by avoiding having the same two of the N-switch groups 207a, 207b, and 207c being in the on state based on successive indications of the control signals 215a and 215b indicating a multiple of 2 of N switches should be in the on state.

If the control signals 215a and 215b from the controller 209 indicate a multiple of 3 of N switches should be in the on state (i.e., the control signal 215a indicating on and the control signal 215b indicating on), the encoder 211 outputs all of the gate signals 217a, 217b, and 217c to indicate the on state.

When the control signals 215a and 215b are different, meaning one of the control signals 215a and 215b indicates an on state and the other indicates an off state, the encoder 211 references the wear counter. The wear counter can indicate a number of different states according to the largest number of different combinations of on/off states of the N-switch groups 207a, 207b, and 207c for any given power demand, using a unique indicator for each of those different states. The wear counter is configured to cycle among the largest number of different combinations of on/off states of the N-switch groups 207a, 207b, and 207c to match any given power demand. For example, the largest number of different combinations of on/off states of the N-switch groups 207a, 207b, and 207c is 3 when the control signals 215a and 215b indicate N number of switches should be turned on or when the control signals 215a and 215B indicate that 2 times N number of switches should be turned on. In other words, in the second embodiment, the wear counter includes a plurality of different indicators such that each of the 3 different combinations of on/off states of the N-switch groups 207a, 207b, and 207c, when the control signal indicates N number of switches or two times N switches, corresponds to a unique indicator. In this second embodiment, there are three states the wear counter needs to indicate, and the encoder 211 cycles through the states by incrementing the wear counter by 1 each time the trigger is received. The states of control signals 215a and 215b, and the gate signals 217a, 217b, and 217c, can be organized into a table as follows.

TABLE 2

| Wear Counter | Control Signal 215a | Control Signal 215b | Gate Signal 217a | Gate Signal 217b | Gate Signal 217c |
|---|---|---|---|---|---|
| 0 | 0 | 0 | 0 | 0 | 0 |
| 1 | 0 | 0 | 0 | 0 | 0 |
| 2 | 0 | 0 | 0 | 0 | 0 |
| 0 | 0 | 1 | 0 | 0 | 1 |
| 1 | 0 | 1 | 0 | 1 | 0 |
| 2 | 0 | 1 | 1 | 0 | 0 |
| 0 | 1 | 0 | 0 | 1 | 1 |
| 1 | 1 | 0 | 1 | 1 | 0 |
| 2 | 1 | 0 | 1 | 0 | 1 |
| 0 | 1 | 1 | 1 | 1 | 1 |
| 1 | 1 | 1 | 1 | 1 | 1 |
| 2 | 1 | 1 | 1 | 1 | 1 |

In Table 2, the value "0" indicates an on state, and the value "1" indicates an off state with respect to the control signals 215a and 215b, and the gate signals 217a, 217b, and 217c. In this embodiment, the encoder 211 determines the gate signals 217a, 217b, and 217c based on the inputs of the wear counter, the control signal 215a, and the control signal 215b according to Table 2.

Upon receipt of the signal 217a, the N-switch group 207a turns to the on state if the signal 217a indicates an on state, and turns to the off state if the signal 217a indicates an off state. Similarly, upon receipt of the signal 217b, the N-switch group 207b turns to the on state if the signal 217b indicates an on state, and turns to the off state if the signal 217b indicates an off state. Upon receipt of the signal 217c, the N-switch group 207c turns to the on state if the signal 217c indicates an on state, and turns to the off state if the signal 217c indicates an off state.

The method of mitigating uneven BTI stress wear based on BTI by using BTI wear leveling shown in FIG. 3 can similarly be applied to the second embodiment.

In a step S100, the controller 209 receives a trigger. The trigger indicates that the power demand of the load 13 is being changed. The trigger can be, for example, when the system voltage, frequency, or function mode of the load 13 changes which is indicated by a wake signal received by the controller 209 from a wake bus (not illustrated). Alternatively, the trigger can be received when accumulated wear information exceeds a predetermined threshold for a switch or group of switches, according to a scheduled event (e.g., monthly, seasonal, semi-annual, etc.), or when a wear leveling firmware is updated.

In the second embodiment, after receiving the trigger in the step S100, the controller 209 receives the power demand of the load 13 via the supply signal 10a in the step S200, and determines a multiple of N of switches that should be turned on to meet the power demand in the step S300.

In the step S300, the controller 209 determines the least number of switches, as a multiple of N, that should be turned on. For example, if the power demand is 0, such as when the load 13 is in a non-function mode, the controller 209 determines that both the control signal 215a and the control signal 215b indicates an off state. If the power demand is greater than 0 and less than of the total power throughput of N switches the controller 209 determines that the control signal 215a indicates an off state and the control signal 215b indicates an on state. If the power demand is greater than the total power throughput of N switches and less than of the total power throughput of twice the number N switches the controller 209 determines that the control signal 215a indicates an on state and the control signal 215b indicates an off state. If the power demand is greater than total power throughput of twice the number N switches, the controller 209 determines that the control signal 215a indicates an on state and the control signal 215b indicates an on state. Upon determining the control signals 215a and 215b, the controller 209 sends the control signals 215a and 215b to the encoder 211 in the step S400.

In the step S500, the encoder 211 receives the control signals 215a and 215b from the controller 209. Then, in the step S600, the encoder 211 selects which of the gate signals 217a, 217b, and 217c to indicate an on state based on the control signals 215a and 215b, as shown in Table 2 above. By referencing the wear counter, the encoder 211 bases the selection of the combination of on/off states based on the previously selected combination of on/off states due to the nature of the round-robin wear leveling policy.

Upon determining the states indicated by the gate signals 217a, 217b, and 217c, the encoder 211 outputs the gate signals 217a, 217b, and 217c to the N-switch groups 207a, 207b, and 207c, and the respective N-switch groups 207a, 207b, and 207c are turned to the state indicated by the respective gate signals 217a, 217b, and 217c, in the step S700.

(4) Third Embodiment

Figure 5:
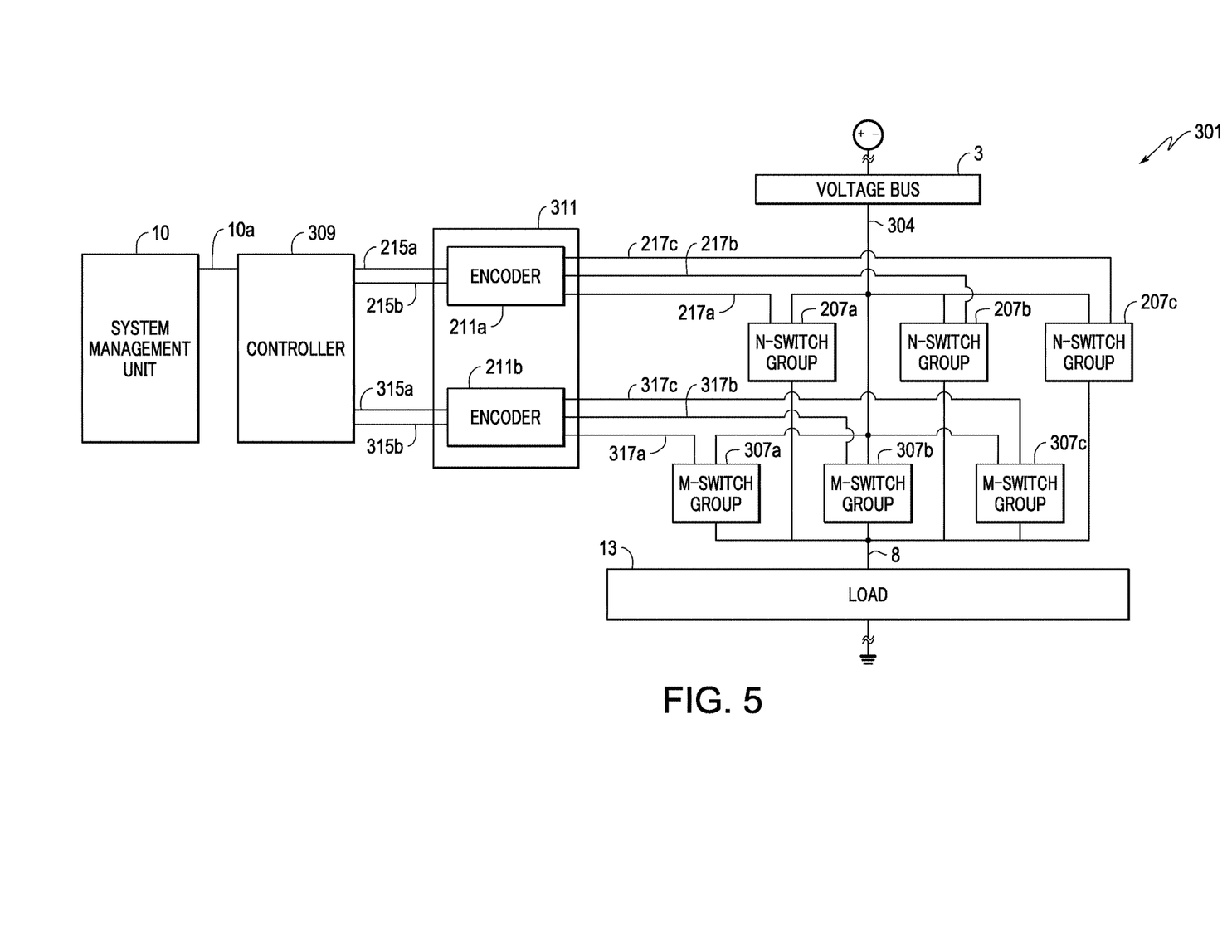
FIG. 5 is a diagram of a third exemplary circuit.

In a third embodiment, the circuit 301 as shown in FIG. 5 includes several elements that are substantially the same as in the circuit 201, as shown in FIG. 4.

In the circuit 301, a bus connector 304 is substantially the same as the bus connector 204 except that it is connected to three additional M-switch groups 307a, 307b, and 307c. Each of the M-switch groups 307a, 307b, and 307c and each of the N-switch groups 207a, 207b, and 207c are electrically connected to the bus 3, an encoder 311, and the load 13. Each of the M-switch groups 307a, 307b, and 307c supply voltage $R_{VDD}$ from the bus 3 via the bus connector 304. When the M-switch group 307a receives a gate signal 317a from the encoder 311, and the gate signal 317a is greater than or equal to the threshold voltage $V_t$, the N-switch group 307a is caused to be in the on state, and provides the load 13 with the core voltage $V_{DDCORE}$ via the load connector 8. Similarly, when the m-switch group 307b receives the gate signal 317b from the encoder 311, and the gate signal 317b is greater than or equal to the threshold voltage $V_t$, the M-switch group 307b is caused to be in the on state, and provides the load 13 with the core voltage $V_{DDCORE}$ via the load connector 8. When the M-switch group 307c receives the gate signal 317c from the encoder 311, and the gate signal 317c is greater than or equal to the threshold voltage $V_t$, the M-switch group 307c is caused to be in the on state, and provides the load 13 with the core voltage $V_{DDCORE}$ via the load connector 8.

In the circuit 301, each of the M-switch groups 307a, 307b, and 307c are structurally identical. Each of the M-switch groups 307a, 307b, and 307c includes the same integer number M of one or more MOSFETs. The number M is different from the number N, and thus the number of MOSFETs inside each N-switch group is different from the number of MOSFETs inside each M-switch group. As described below, the number M is four times the number N in the present embodiment (i.e., M=4×N). Each MOSFET in the M-switch groups 307a can receive the gate signal 317a from the encoder 311 at a gate input, receive the supply voltage $R_{VDD}$ from the voltage bus 3 at a source input, and output the core voltage $V_{DDCORE}$ to the load 13 from a drain when the MOSFET is in the on state as described above. Similarly, each MOSFET in the M-switch groups 307b can receive the gate signal 317b from the encoder 311 at a gate input, receive the supply voltage $R_{VDD}$ from the voltage bus 3 at a source input, and output the core voltage $V_{DDCORE}$ to the load 13 from a drain when the MOSFET is in the on state as described above. Each MOSFET in the M-switch groups 307c can receive the gate signal 317c from the encoder 311 at a gate input, receive the supply voltage $R_{VDD}$ from the voltage bus 3 at a source input, and output the core voltage $V_{DDCORE}$ to the load 13 from a drain when the MOSFET is in the on state as described above. Accordingly, each of the N-switch groups 307a, 307b, and 307c can respectively provide the same amount of power. Thus, the total power throughput the circuit 301 can provide to the load 13 is the sum of the power throughputs of the N-switch groups 207a, 207b, and 207c and the M-switch groups 307a, 307b, and 307c.

The circuit 301 includes a controller 309. The controller 309 is similar to the controller 209. The controller 309 receives the power demand of the load 13 from the system management unit 10, and makes a determination of which switches should be turned on to meet the power demand. Unlike the controller 209, the controller 309 operates such that a first control signal 215a, a second control signal 215b, a third control signal 315a, and a fourth control signal 315b are output to an encoder 311, which is described below. The third control signal 315a can indicate that a number of switches equal to twice the number M switches of each of the M-switch groups 307a, 307b, and 307c should be turned on. The fourth control signal 315b can indicate that a number of switches equal to the number M of any of the M-switch groups 307a, 307b, and 307c should be turned on. In other words, because each of the M-switch groups 307a, 307b, and 307c each have M switches, the controller 209 can output a binary weighted signal via the third control signal 315a and the fourth control signal 315b, a indicating any of the multiples 0, 1, 2, or 3 of the number M switches should be turned on. Moreover, in the second embodiment, the number M is four times the number N (i.e., M=4×N). However, it should be understood that the number M can be any number different from N and is not limited to this exemplary embodiment.

The control signals 215a, 215b, 315a, and 315b are sent to the encoder 311. Although FIG. 5 illustrates individual electrical connections for each of the control signals 215a, 215b, 315a, and 315b, the control signals 215a, 215b, 315a, and 315b can be sent over any number of electrical connections. Although control signals 215a, 215b, 315a, and 315b are described and illustrated as different signals, the control signals 215a, 215b, 315a, and 315b can alternatively be considered as components of a single control signal The encoder 311 locates between the controller 309 and the N-switch groups 207a, 207b, and 207c and M-switch groups 307a, 307b, and 307c. The encoder 311 implements a specific wear leveling policy like the encoders of the foregoing embodiments. For example, the encoder 311 can implement a wear leveling policy based on a state machine by unsupervised learning. In the third embodiment, as in the other embodiments, the encoder 311 implements a round-robin wear leveling policy.

The encoder 311 receives the control signals 215a, 215b, 315a, and 315b from the controller 309. The encoder 311 also includes a wear counter. The encoder 311 includes sub-encoders 211a and 211b. Structurally and functionally, the sub encoders 211a and 211b are equivalent to the encoder 211 of the second embodiment. In the third embodiment, the sub-encoder 211a receives the control signals 215a and 215b, and outputs the gate signals 217a, 217b, and 217c. The sub-encoder 211b receives the control signals 315a and 315b, and outputs the gate signals 317a, 317b, and 317c. The encoder 311 then determines the number of switches that need to be open based on the control signals 215a, 215b, 315a, and 315b, each of the control signals 215a and 215b indicating a multiple of N switches, and each of the control signals 315a and 315b indicating a multiple of M switches, as described above. Because the controller 309 can output a binary weighted signal via the first control signal 215a, the second control signal 215b, the third control signal 315a, and the fourth control signal 315b, the encoder 311 allows for implementation of related methods of determining power demand that rely on binary weighted groups of switches.

If the control signals 215a and 215b from the controller 309 indicate a multiple of 0 of N switches should be in the on state (the control signal 215a indicating off and the control signal 215b indicating off), the encoder 311 outputs a gate signal 217a to the N-switch group 207a indicating that the N-switch group 207a should be in the off state, outputs a gate signal 217b indicating that the N-switch group 207b should be in the off state, and outputs a gate signal 217c indicating that the N-switch group 207c should be in the off state.

If the control signals 315a and 315b from the controller 309 indicate a multiple of 0 of M switches should be in the on state (the control signal 315a indicating off and the control signal 315b indicating off), the encoder 311 outputs a gate signal 317a to the M-switch group 307a indicating that the M-switch group 307a should be in the off state, outputs a gate signal 317b indicating that the M-switch group 307b should be in the off state, and outputs a gate signal 317c indicating that the M-switch group 307c should be in the off state.

If the control signals 215a and 215b from the controller 309 indicate a multiple of 1 of N switches should be in the on state (the control signal 215a indicating off and the control signal 215b indicating on), the encoder 311 selects only one of the gate signals 217a, 217b, and 217c to be in the on state, and outputs the remaining two of the gate signals 217a, 217b, and 217c to be in the off state. The selected one of the gate signals 217a, 217b, and 217c is selected based on the wear leveling policy, such as the round robin policy, to mitigate BTI wear by avoiding having only one of the N-switch groups 207a, 207b, and 207c being on based on successive indications of the control signals 215a and 215b indicating a multiple of 1 of N switches should be in the on state.

If the control signals 315a and 315b from the controller 309 indicate a multiple of 1 of M switches should be in the on state (i.e., the control signal 315a indicating off and the control signal 315b indicating on), the encoder 311 selects only one of the gate signals 317a, 317b, and 317c to be in the on state, and outputs the remaining two of the gate signals 317a, 317b, and 317c to be in the off state. The selected one of the gate signals 317a, 317b, and 317c is selected based on the wear leveling policy, such as the round robin policy, to mitigate BTI wear by avoiding having only one of the M-switch groups 307a, 307b, and 307c being on based on successive indications of the control signals 315a and 315b indicating a multiple of 1 of N switches should be in the on state.

If the control signals 215a and 215b from the controller 309 indicate a multiple of 2 of N switches should be in the on state (i.e., the control signal 215a indicating on and the control signal 215b indicating off), the encoder 311 selects two of the gate signals 217a, 217b, and 217c to indicate the on state, and outputs the remaining one of the gate signals 217a, 217b, and 217c to indicate the off state. The selected two of the gate signals 217a, 217b, and 217c are selected based on the wear leveling policy, such as the round robin policy, to mitigate BTI wear by avoiding having the same two of the N-switch groups 207a, 207b, and 207c being on based on successive indications of the control signals 215a and 215b indicating a multiple of 2 of N switches should be in the on state.

If the control signals 315a and 315b from the controller 309 indicate a multiple of 2 of M switches should be in the on state (i.e., the control signal 315a indicating on and the control signal 315b indicating off), the encoder 311 selects two of the gate signals 317a, 317b, and 317c to indicate the on state, and outputs the remaining one of the gate signals 317a, 317b, and 317c as indicating the off state. The selected two of the gate signals 317a, 317b, and 317c are selected based on the wear leveling policy, such as the round robin policy, to mitigate BTI wear by avoiding having the same two of the M-switch groups 307a, 307b, and 307c being on based on successive indications of the control signals 315a and 315b indicating a multiple of 2 of M switches should be in the on state.

If the control signals 215a and 215b from the controller 209 indicate a multiple of 3 of N switches should be in the on state (the control signal 215a indicating on and the control signal 215b indicating on), and the control signals 315a and 315b indicate a multiple of 3 of M switches should be in the on state (the control signal 315a indicating on and the control signal 315b indicating on), the encoder 311 outputs all of the gate signals 217a, 217b, 217c, 317a, 317b, and 317c to indicate the on state.

When the control signals 315a and 315b are different, meaning one of the control signals 315a and 315b indicates an on state and the other indicates an off state, the encoder 311 references the wear counter. The wear counter can indicate a number of different states according to the largest number of different combinations of on/off states of the M-switch groups 307a, 307b, and 307c for any given power demand, using a unique indicator for each of those different states. The wear counter is configured to cycle among the largest number of different combinations of on/off states of the M-switch groups 307a, 307b, and 307c to match any given power demand. For example, the largest number of different combinations of on/off states of the M-switch groups 307a, 307b, and 307c is 3 when the control signals 315a and 315b indicate M number of switches should be turned on or when the control signals 315a and 315B indicate that 2 times M number of switches should be turned on. In other words, in the third embodiment, the wear counter includes a plurality of different indicators such that each of the 3 different combinations of on/off states of the M-switch groups 307a, 307b, and 307c, when the control signal indicates M number of switches or two times M switches, corresponds to a unique indicator. In this third embodiment, there are three states the wear counter needs to indicate, and cycles through the states by incrementing the wear counter by 1 each time the trigger is received. The states of control signals 315a and 315b, and the gate signals 317a, 317b, and 317c can be organized into a table as follows.

TABLE 3

| Wear Counter | Control Signal 315a | Control Signal 315b | Gate Signal 317a | Gate Signal 317b | Gate Signal 317c |
|---|---|---|---|---|---|
| 0 | 0 | 0 | 0 | 0 | 0 |
| 1 | 0 | 0 | 0 | 0 | 0 |
| 2 | 0 | 0 | 0 | 0 | 0 |
| 0 | 0 | 1 | 0 | 0 | 1 |
| 1 | 0 | 1 | 0 | 1 | 0 |
| 2 | 0 | 1 | 1 | 0 | 0 |
| 0 | 1 | 0 | 0 | 1 | 1 |
| 1 | 1 | 0 | 1 | 1 | 0 |
| 2 | 1 | 0 | 1 | 0 | 1 |
| 0 | 1 | 1 | 1 | 1 | 1 |
| 1 | 1 | 1 | 1 | 1 | 1 |
| 2 | 1 | 1 | 1 | 1 | 1 |

In Table 3, the value "0" indicates an on state, and the value "1" indicates an off state with respect to the control signals 315a and 315b, and the gate signals 317a, 317b, and 317c. In this embodiment, the encoder 311 determines the gate signals 217a, 217b, and 217c based on the inputs of the wear counter, the control signal 215a, and the control signal 215b according to Table 2. Similarly, the encoder 311 determines the gate signals 317a, 317b, and 317c based on the inputs of the wear counter 19b, the control signal 315a, and the control signal 315b according to Table 3.

Upon receipt of the signal 217a, the N-switch group 207a turns to the on state if the signal 217a indicates an on state, and turns off if the signal 217a indicates an off state. Similarly, upon receipt of the signal 217b, the N-switch group 207b turns to the on state if the signal 217b indicates an on state, and turns off if the signal 217b indicates an off state. Upon receipt of the signal 217c, the N-switch group 207c turns to the on state if the signal 217c indicates an on state, and turns off if the signal 217c indicates an off state.

Upon receipt of the signal 217a, the N-switch group 207a turns to the on state if the signal 217a indicates an on state, and turns off if the signal 217a indicates an off state. Similarly, upon receipt of the signal 217b, the N-switch group 207b turns to the on state if the signal 217b indicates an on state, and turns off if the signal 217b indicates an off state. Upon receipt of the signal 217c, the N-switch group 207c turns to the on state if the signal 217c indicates an on state, and turns off if the signal 217c indicates an off state.

Upon receipt of the signal 317a, the M-switch group 307a turns to the on state if the signal 317a indicates an on state, and turns off if the signal 317a indicates an off state. Similarly, upon receipt of the signal 317b, the M-switch group 307b turns to the on state if the signal 317b indicates an on state, and turns off if the signal 317b indicates an off state. Upon receipt of the signal 317c, the M-switch group 307c turns to the on state if the signal 317c indicates an on state, and turns off if the signal 317c indicates an off state.

The method of mitigating uneven BTI stress wear based on BTI by using BTI wear leveling shown in FIG. 3 can similarly be applied to the second embodiment.

In a step S100, the controller 309 receives a trigger. The trigger indicates that the power demand of the load 13 is being changed. The trigger can be, for example, when the system voltage, frequency, or function mode of the load 13 changes which is indicated by a wake signal received by the controller 209 from a wake bus (not illustrated). Alternatively, the trigger can be when accumulated wear information exceeds a predetermined threshold, according to a scheduled event (e.g., monthly, seasonal, semi-annual, etc.), or when a wear leveling firmware is updated.

In the third embodiment, after receiving the trigger in the step S100, the controller 309 receives the power demand of the load 13 via the supply signal 10a in the step S200, and determines a multiple of N of switches that should be turned on, and a multiple of M of switches that should be turned on, to meet the power demand in the step S300.

In the step S300, the controller 309 determines the least number of switches, as a multiple of N, that should be turned on. Because the number M is four times the number N, the controller 309 can determine which control signals 215a, 215b, 315a, and 315b should indicate the on state, to indicate any multiple of N switches between 0 and 11. Upon determining the control signals 215a, 215b, 315a, and 315b, the controller 309 sends the control signals 215a, 215b, 315a, and 315b to the encoder 311 in the step S400.

In the step S500, the encoder 311 receives the control signals 215a, 215b, 315a, and 315b from the controller 309. Then, in the step S600, the encoder 311 selects which of the gate signals 217a, 217b, 217c, 317a, 317b, and 317c are to indicate an on state based on the control signals 215a, 215b, 315a, and 315b, as shown in Table 2 and Table 3 above. By referencing the wear counter, the encoder 311 bases the selection of one of the combinations of on/off states on the previously selected combination of on/off states due to the nature of the round-robin wear leveling policy.

Upon determining the states indicated by the gate signals 217a, 217b, 217c, 317a, 317b, and 317c, the encoder 311 outputs the gate signals 217a, 217b, and 217c to the N-switch groups 207a, 207b, and 207c, and outputs the gate signals 317a, 317b, and 317c to the M-switch groups 307a, 307b, and 307c. The respective N-switch groups 207a, 207b, and 207c are turned to the state indicated by the respective gate signals 217a, 217b, and 217c, and the respective M-switch groups 307a, 307b, and 307c are turned to the state indicated by the respective gate signals 317a, 317b, and 317c in the step S700.

(5) Alternatives

Although only two switches are currently described for the sake of simplicity in the first embodiment, additional switches can be added. Similarly, although each of the first switch 5 and the second switch 7 are currently described as having the same number of MOSFETs, and accordingly are able to respectively provide the same amount of power, the number and power throughput of each of the first switch 5 and the second switch 7 can be different in alternative embodiments.

Although the encoders 11, 211, and 311 are described as implementing a round-robin wear leveling policy, any other appropriate policy can be implemented such as a threshold based wear leveling policy, a time based wear leveling policy, a duty cycle ratio based wear leveling policy, and a machine learning based wear leveling policy.

The encoders 11, 211, and 311 are each implemented as an independent logic circuit between the controller 9 and the respective switches or switch groups, however the encoders 11, 211, and 311 can be wear translation layers in firmware loaded to registers during machine boot-up and can be easily updated.

Although the third embodiment describes the number M being a different number than N, the number M can be equal to the number N in an alternative embodiment. Similarly, the numbers N and M can be any arbitrary integer.

As discussed above, the above-mentioned exemplary embodiments are not limited to the examples and descriptions herein, and may include additional features and modifications as would be within the ordinary skill of a skilled artisan in the art. For example, the alternative or additional aspects of the exemplary embodiments may be combined as well. The foregoing disclosure of the exemplary embodiments has been provided for the purposes of illustration and description. This disclosure is not intended to be exhaustive or to be limited to the precise forms described above. Obviously, many modifications and variations will be apparent to artisans skilled in the art. The embodiments were chosen and described in order to best explain principles and practical applications, thereby enabling others skilled in the art to understand this disclosure for various embodiments and with the various modifications as are suited to the particular use contemplated.

What is claimed is:

1. A circuit comprising:
a voltage bus;
a load;
a plurality of switches including
a first switch group electrically connected between the voltage bus and the load, the first switch group comprising N switches connected in parallel, where N is an integer greater than or equal to 1;
a second switch group electrically connected between the voltage bus and the load, the second switch group comprising M switches connected in parallel, where M is an integer multiple of N;
a controller configured to provide a first output signal indicating a required number of switches to be turned on to meet a power demand of the load; and
an encoder electrically connected to the controller, the first switch group, and the second switch group, the encoder being configured to
select a first combination of on/off states of the first switch group and the second switch group based on (i) the first output signal from the controller and (ii) a second combination of on/off states of the first switch group and the second switch group, and
in response to selecting the first combination, transmits a switch signal to effect the first combination.

2. The circuit of claim 1, wherein
M is equal to N,
the encoder is configured to select the second combination when a second output signal of the controller is received after the first output signal of the controller has been received, and the first output signal and the second output signal both indicate the same required number of switches, and
the first combination is different from the second combination.

3. The circuit of claim 1, further comprising:
a third switch group electrically connected between the voltage bus and the load, the third switch group comprising N switches connected in parallel, wherein
M is equal to N, and
the encoder is configured to
select a third combination of on/off states of the first switch group, the second switch group, and the third switch group based on (i) a third output signal from the controller and (ii) a fourth combination of on/off states of the first switch group, the second switch group, and the third switch group, and
in response to selecting the third combination, transmits the switch signal to effect the third combination.

4. The circuit of claim 3, wherein
the encoder is configured to select a fifth combination of on/off states of the first switch group, the second switch group, and the third switch group when a fourth output signal of the controller is received after the third output signal of the controller has been received, and the third output signal and the fourth output signal both indicate the same required number of switches, and each of the third combination, the fourth combination, and the fifth combination are different.

5. The circuit of claim 1, further comprising:

a third switch group electrically connected between the voltage bus and the load, the third switch group comprising N switches connected in parallel;

a fourth switch group electrically connected between the voltage bus and the load, the fourth switch group comprising N switches connected in parallel;

a fifth switch group electrically connected between the voltage bus and the load, the fifth switch group comprising M switches connected in parallel;

a sixth switch group electrically connected between the voltage bus and the load, the sixth switch group comprising M switches connected in parallel, wherein the encoder is configured to
select a sixth combination of on/off states of the first switch group, the second switch group, the third switch group, the fourth switch group, the fifth switch group, and the sixth switch group based on (i) a fifth output signal from the controller and (ii) a seventh combination of on/off states of the first switch group, the second switch group, the third switch group, the fourth switch group, the fifth switch group, and the sixth switch group, and in response to selecting the sixth combination, transmits the switch signal to effect the sixth combination.

6. The circuit of claim 5, wherein the encoder is configured to select an eighth combination of on/off states of the first switch group, the second switch group, the third switch group, the fourth switch group, the fifth switch group, and the sixth switch group when a sixth output signal of the controller is received after the fifth output signal of the controller has been received, and the fifth output signal and the sixth output signal both indicate the same required number of switches, and each of the sixth combination, the seventh combination, and the eighth combination are different.

7. The circuit of claim 5, wherein M is equal to N.

8. The circuit of claim 5, wherein M is greater than N.

9. The circuit of claim 8, wherein M is four times N.

10. The circuit of claim 1, wherein the encoder is configured to select the first combination after the controller receives a trigger indicating that the power demand of the load is being updated or that a Bias Temperature Instability (BTI) wear threshold of the plurality of switches has been met.

11. A method of Bias Temperature Instability (BTI) wear leveling, the method comprising:

receiving a power demand of a load;

determining a number of switches of a plurality of switches between a voltage bus and the load required to be turned on based on the power demand;

outputting a first control signal indicating the determined number of switches required to be turned on to an encoder;

selecting, using the encoder, a first combination of on/off states of the plurality of switches based on the control signal and a second combination of on/off states of the plurality of switches;

transmitting the switch signal from the encoder to the switches to effect the first combination; and receiving a trigger indicating that the power demand of the load is being updated or a BTI wear threshold has been met, and wherein the selecting the selection of the first combination occurs after receipt of the trigger.

12. The method of claim 11, further comprising selecting, using the encoder, the second combination when a second output signal is received by the encoder after the first output signal has been received by the encoder, wherein the first combination includes the same number of on states of switches as the second combination, and the first combination is different from the second combination.

13. A method of Bias Temperature Instability (BTI) wear leveling, the method comprising:

receiving a power demand of a load;

determining a number of switches of a plurality of switches between a voltage bus and the load required to be turned on based on the power demand;

outputting a first control signal indicating the determined number of switches required to be turned on to an encoder;

selecting, using the encoder, a first combination of on/off states of the plurality of switches based on the control signal and a second combination of on/off states of the plurality of switches;

selecting, using the encoder, the second combination when a second output signal is received by the encoder after the first output signal has been received by the encoder, wherein the first combination includes the same number of on states of switches as the second combination, and the first combination is different from the second combination; and transmitting the switch signal from the encoder to the switches to effect the first combination.

14. The method of claim 13, further comprising receiving a trigger indicating that the power demand of the load is being updated or a BTI wear threshold has been met, and wherein the selecting the selection of the first combination occurs after receipt of the trigger.

* * * * *